United States Patent
Zhao et al.

(10) Patent No.: US 9,893,308 B2
(45) Date of Patent: Feb. 13, 2018

(54) QUANTUM DOT LIGHTING DEVICES

(71) Applicant: Shenzhen China Star Optoelectronics Technology Co., Ltd., Shenzhen, Guangdong (CN)

(72) Inventors: Feng Zhao, Guangdong (CN); Jin Cao, Guangdong (CN); Xue Zhang, Guangdong (CN); Jie Zhou, Guangdong (CN); Jingwei Xie, Guangdong (CN); Jianhua Zhang, Guangdong (CN); Yu-chih Wu, Guangdong (CN); Chung-Yi Chiu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 208 days.

(21) Appl. No.: 14/759,196

(22) PCT Filed: Jun. 5, 2015

(86) PCT No.: PCT/CN2015/080878
§ 371 (c)(1),
(2) Date: Jul. 2, 2015

(87) PCT Pub. No.: WO2016/187897
PCT Pub. Date: Dec. 1, 2016

(65) Prior Publication Data
US 2017/0141334 A1 May 18, 2017

(30) Foreign Application Priority Data

May 22, 2015 (CN) .......................... 2015 1 0266845

(51) Int. Cl.
*H01L 33/06* (2010.01)
*H01L 51/50* (2006.01)
(Continued)

(52) U.S. Cl.
CPC ........ *H01L 51/502* (2013.01); *H01L 51/0096* (2013.01); *H01L 51/504* (2013.01);
(Continued)

(58) Field of Classification Search
CPC . H01L 51/502; H01L 51/504; H01L 51/5056; H01L 51/5072; H01L 51/5088;
(Continued)

(56) References Cited

U.S. PATENT DOCUMENTS

2007/0077594 A1* 4/2007 Hikmet ................. B82Y 10/00
435/7.1
2007/0114922 A1 5/2007 Sung et al.
(Continued)

FOREIGN PATENT DOCUMENTS

| CN | 203085547 U | 7/2013 |
|---|---|---|
| CN | 103605234 A | 2/2014 |
| CN | 103730584 A | 4/2014 |
| CN | 104766878 A | 7/2015 |
| WO | 2015025950 A1 | 2/2015 |

*Primary Examiner* — Fei Fei Yeung Lopez
(74) *Attorney, Agent, or Firm* — Andrew C. Cheng

(57) ABSTRACT

A quantum dot lighting device includes a quantum-dot-lighting layer and two main structural layers being arranged at two sides of the quantum-dot-lighting layer along a vertical direction. The quantum-dot-lighting layer includes a red lighting unit, a green lighting unit, and a red lighting unit. The red lighting unit includes red quantum dots, the green lighting unit includes green quantum dots, and the blue lighting unit includes blue quantum dots. A number of the blue quantum dots is larger than the number of the green quantum dots, and the number of the green quantum dots is larger than the number of the red quantum dots. With the configuration, the material of the quantum dots may be reduced, and the pureness of the white light beams may be enhanced.

8 Claims, 2 Drawing Sheets

(51) Int. Cl.
*H01L 51/52* (2006.01)
*H01L 51/00* (2006.01)

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5096* (2013.01); *H01L 51/5206* (2013.01); *H01L 51/5221* (2013.01)

(58) Field of Classification Search
CPC ............ H01L 51/5092; H01L 51/5096; H01L 51/5206; H01L 51/5221
See application file for complete search history.

(56) References Cited

U.S. PATENT DOCUMENTS

| | | | |
|---|---|---|---|
| 2008/0150418 A1* | 6/2008 | Chae | B82Y 20/00 313/504 |
| 2009/0272998 A1 | 11/2009 | Dirk et al. | |
| 2010/0140645 A1* | 6/2010 | Shibata | H01L 51/5016 257/98 |
| 2010/0213438 A1 | 8/2010 | Cho et al. | |
| 2015/0014719 A1 | 1/2015 | Jao et al. | |
| 2015/0083991 A1* | 3/2015 | Tang | H01L 33/0083 257/13 |
| 2016/0028035 A1* | 1/2016 | Yang | H01L 51/502 257/40 |
| 2016/0240592 A1 | 8/2016 | Song et al. | |
| 2016/0254474 A1 | 9/2016 | Zou | |
| 2016/0260921 A1 | 9/2016 | Liu et al. | |

* cited by examiner

QUANTUM DOT LIGHTING DEVICES

BACKGROUND OF THE INVENTION

1. Field of the Invention

The present disclosure relates to lighting device technology, and more particularly to a quantum dot lighting device.

2. Discussion of the Related Art

Quantum dots are invisible semiconductor nano-crystal having very small volume. The diameter of the particle is less than 10 nanometers. One of the characteristics of the quantum dots is that the quantum dots emit colorful light beams when being triggered by light or electricity. The color of the light beams is determined by the material, volume, and shape of the quantum dots. Thus, the color of the light beams of the quantum dots may be changed by altering the light source.

Currently, the white light beams emitted by the quantum dots are obtained by mixing the red, green, and blue (RGB) colors. However, conventionally, blue, red, and green quantum dots are mixed together. The light beams emitted by the blue quantum dots may be absorbed by the green and red quantum dots in a rim. As such, a portion of the blue light beams are eliminated, which results in less white light beams.

Thus, a quantum dot lighting device is needed to overcome the above-mentioned problem.

SUMMARY

The object of the invention is to provide a quantum dot lighting device for saving the material of quantum dots and the pureness of the white light beams may be enhanced.

In one aspect, a quantum dot lighting device includes: a quantum-dot-lighting layer and two main structural layers being arranged at two sides of the quantum-dot-lighting layer along a vertical direction; the quantum-dot-lighting layer comprising a red lighting unit, a green lighting unit, and a red lighting unit, the red lighting unit comprising red quantum dots, the green lighting unit comprising green quantum dots, and the blue lighting unit comprising blue quantum dots, a number of the blue quantum dots is larger than the number of the green quantum dots, and the number of the green quantum dots is larger than the number of the red quantum dots; and wherein the main structural layer comprising a substrate, an anode, a cavity injection layer, a cavity transportation layer, an electron transportation layer, an electron injection layer, and a cathode, and the anode, the cavity injection layer, the cavity transportation layer, the electron transportation layer, the electron injection layer, and the cathode being stacked on the substrate in turn; and the main structural layer further comprising a cavity blocking layer and an electron blocking layer, the cavity blocking layer being arranged between the cavity transportation layer and the quantum-dot-lighting layer, the electron blocking layer being arranged between the electron transportation layer and the quantum-dot-lighting layer, reflective rates of the quantum-dot-lighting layer, the cavity blocking layer, the electron transportation layer, the electron injection layer, the cathode being configured to be increased gradually in sequence, and the reflective rates of the quantum-dot-lighting layer, the electron blocking layer, the cavity transportation layer, the cavity injection layer, and the anode being configured to be increased gradually in sequence.

Wherein the quantum-dot-lighting layer is rectangular-shaped, and the blue lighting unit is arranged between the red lighting unit and the green lighting unit.

Wherein the red lighting unit, the blue lighting unit, and the green lighting unit are arranged along a diagonal line of the rectangular quantum-dot-lighting layer.

Wherein ratios of the dimensions of the blue lighting unit, the green lighting unit, and the red lighting unit are configured to be (10~14):(6~9):1.

Wherein the red lighting unit, the green lighting unit, and the blue lighting unit are stacked together in turn.

Wherein ratios of the volume of the blue lighting unit, the green lighting unit, and the red lighting unit are configured to be (10~14):(6~9):1.

Wherein the quantum-dot-lighting layer is circular-shaped, the blue lighting unit, the green lighting unit, and the red lighting unit are ring-shaped, the red lighting unit is a circle and is arranged at a center of the quantum-dot-lighting layer, and the green lighting unit is arranged between the red lighting unit and the blue lighting unit.

Wherein ratios of the radius of the blue lighting unit, the green lighting unit, and the red lighting unit are configured to be (10~14):(6~9):1.

In another aspect, a quantum dot lighting device includes: a quantum-dot-lighting layer and two main structural layers being arranged at two sides of the quantum-dot-lighting layer along a vertical direction; and the quantum-dot-lighting layer comprising a red lighting unit, a green lighting unit, and a red lighting unit, the red lighting unit comprising red quantum dots, the green lighting unit comprising green quantum dots, and the blue lighting unit comprising blue quantum dots, a number of the blue quantum dots is larger than the number of the green quantum dots, and the number of the green quantum dots is larger than the number of the red quantum dots.

Wherein the quantum-dot-lighting layer is rectangular-shaped, and the blue lighting unit is arranged between the red lighting unit and the green lighting unit.

Wherein the red lighting unit, the blue lighting unit, and the green lighting unit are arranged along a diagonal line of the rectangular quantum-dot-lighting layer.

Wherein ratios of the dimensions of the blue lighting unit, the green lighting unit, and the red lighting unit are configured to be (10~14):(6~9):1.

Wherein the red lighting unit, the green lighting unit, and the blue lighting unit are stacked together in turn.

Wherein ratios of the volume of the blue lighting unit, the green lighting unit, and the red lighting unit are configured to be (10~14):(6~9):1.

Wherein the quantum-dot-lighting layer is circular-shaped, the blue lighting unit, the green lighting unit, and the red lighting unit are ring-shaped, the red lighting unit is a circle and is arranged at a center of the quantum-dot-lighting layer, and the green lighting unit is arranged between the red lighting unit and the blue lighting unit.

Wherein ratios of the radius of the blue lighting unit, the green lighting unit, and the red lighting unit are configured to be (10~14):(6~9):1.

In another aspect, a quantum dot lighting device includes: a quantum-dot-lighting layer and two main structural layers being arranged at two sides of the quantum-dot-lighting layer along a vertical direction; and the quantum-dot-lighting layer comprising a red lighting unit, a green lighting unit, and a red lighting unit, the red lighting unit comprising red quantum dots, the green lighting unit comprising green quantum dots, and the blue lighting unit comprising blue quantum dots, luminous flux generated by the blue quantum dots is larger than the luminous flux generated by the green quantum dots, and the luminous flux generated by the green quantum dots is larger than the luminous flux generated by the red quantum dots.

Wherein a number of the blue quantum dots is larger than the number of the green quantum dots, and the number of the green quantum dots is larger than the number of the red quantum dots.

In view of the above, the number of the blue quantum dots is larger than the number of the green quantum dots, and the number of the green quantum dots is larger than the number of the red quantum dots. With such configuration, the blue light beams are prevented from being absorbed by the red and green lighting unit. At the same time, the green light beams are prevented from being absorbed by the red lighting unit. Thus, the blue lighting unit, the red lighting unit, and the green lighting unit may emit soft white light beams, i.e., the white light beams having better index. In this way, the material of quantum dots may be reduced, and the purity of the white light beams is enhanced.

DETAILED DESCRIPTION OF THE EMBODIMENTS

Embodiments of the invention will now be described more fully hereinafter with reference to the accompanying drawings, in which embodiments of the invention are shown.

Figure 1:
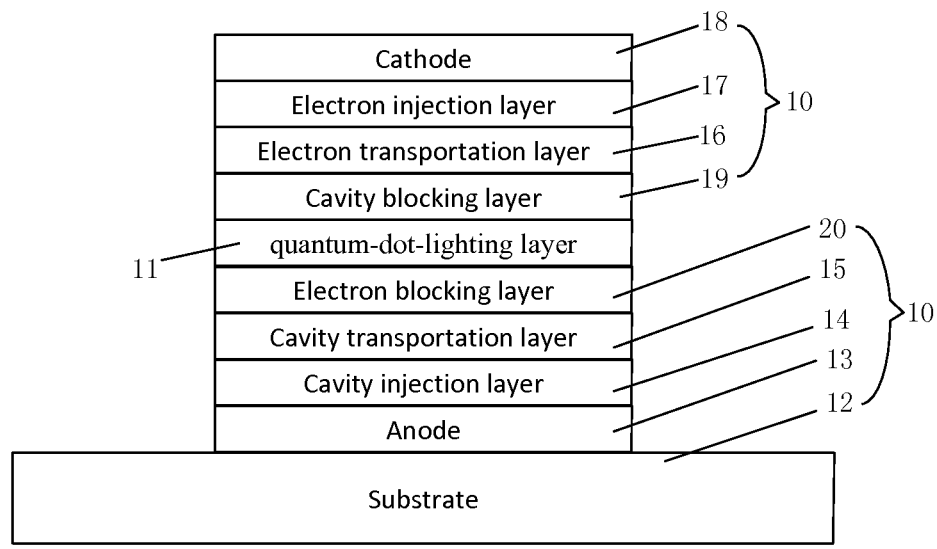
FIG. 1 is a schematic view is a schematic view of the quantum dot lighting device in accordance with one embodiment.

FIG. 1 is a schematic view is a schematic view of the quantum dot lighting device in accordance with one embodiment. The quantum dot lighting device includes a quantum-dot-lighting layer 11 and two main structural layers (not shown) arranged at two sides of the quantum-dot-lighting layer 11 along a vertical direction.

Preferably, the quantum dot lighting device may be a Quantum Dots LED (QDLed).

The main structural layer 10 includes a substrate 12, an anode 13, a cavity injection layer 14, a cavity transportation layer 15, an electron transportation layer 16, an electron injection layer 17, and a cathode 18. The anode 13, the cavity injection layer 14, the cavity transportation layer 15, the electron transportation layer 16, the electron injection layer 17, and the cathode 18 are stacked on the substrate 12 in turn.

Preferably, the main structural layer 10 further includes a cavity blocking layer 19 and an electron blocking layer 20. The cavity blocking layer 19 is arranged between the cavity transportation layer 15 and the quantum-dot-lighting layer 11. The electron blocking layer 20 is arranged between the electron transportation layer 16 and the quantum-dot-lighting layer 11. In this way, the collisions between the electrons and the cavity is increased.

Preferably, the reflective rates of the quantum-dot-lighting layer 11, the cavity blocking layer 19, the electron transportation layer 16, the electron injection layer 17, the cathode 18 have been configured to be increased in sequence. The reflective rates of the quantum-dot-lighting layer 11, the electron blocking layer 20, the cavity transportation layer 15, the cavity injection layer 14, and the anode 13 have been configured to be increased gradually in sequence. By gradually increasing the reflective rate, the light beams emitted from the quantum-dot-lighting layer 11 passing through the media having a lower density and then passing through the media having a higher density. Thus, the light beams are not reflected when passing through the layers, which enhance the light emission rate.

The quantum-dot-lighting layer 11 is located in a kernel of the lighting area. After the cathode 18 and the anode 13 have been connected to a power supply, the quantum-dot-lighting layer 11 emits lights after being triggered by the main structural layer 10.

The quantum-dot-lighting layer 11 includes a red lighting unit, a green lighting unit, and a red lighting unit. The red lighting unit includes the red quantum dots.

Green lighting unit includes green quantum dots, and blue lighting unit includes blue quantum dots. A number of the blue quantum dots is larger than the number of the green quantum dots. In an example, the number of the green quantum dots is larger than the number of the red quantum dots. In other examples, the volume, the dimension, the weight, or the diameter of the blue lighting unit is larger than that of the green lighting unit. As such, the volume, the dimension, the weight, or the diameter of the green lighting unit is larger than that of the red lighting unit In other words, luminous flux generated by the blue quantum dots is larger than that generated by the green quantum dots, and the luminous flux generated by the green quantum dots is larger than that generated by the red quantum dots.

Figure 2:
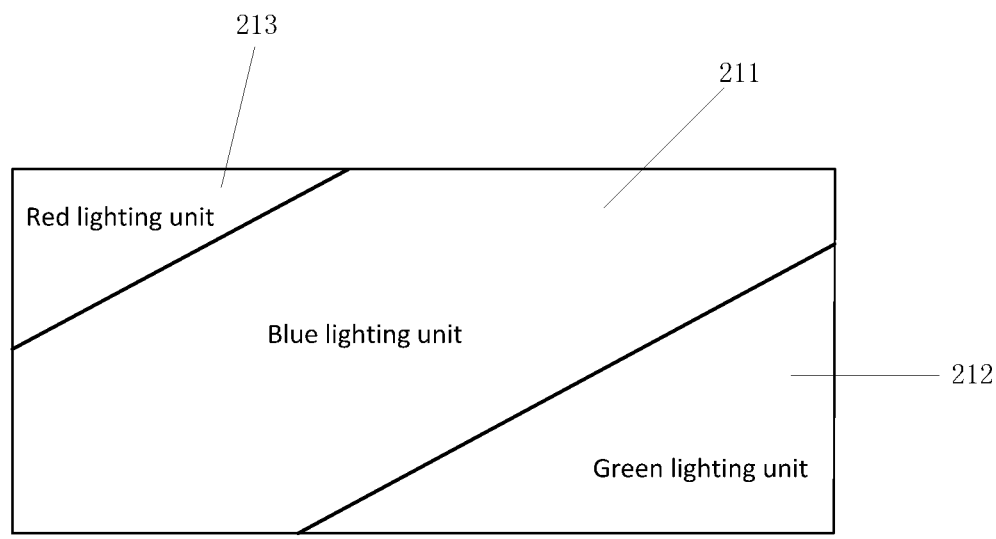
FIG. 2 is a schematic view of the quantum-dot-lighting layer of the quantum dot lighting device in accordance with a first embodiment.

Referring to FIGS. 1 and 2, FIG. 2 is a schematic view of the quantum-dot-lighting layer of the quantum dot lighting device in accordance with a first embodiment. In an example, the quantum-dot-lighting layer 21 is rectangular-shaped, and the blue lighting unit 211 is arranged between the red lighting unit 213 and the green lighting unit 212.

Preferably, the red lighting unit 213, the blue lighting unit 211, and the green lighting unit 212 are arranged along a diagonal line of the rectangular quantum-dot-lighting layer 21.

More preferably, the ratio of the dimensions of the blue lighting unit 211, the green lighting unit 212, and the red lighting unit 213 are configured to be (10~14):(6~9):1.

Also referring to Table 1 below, the ratio of the dimensions of the blue lighting unit 211, the green lighting unit 212, and the red lighting unit 213 are configured to be 12:8:1.

In this scenario, the white-light index is the best.

TABLE 1

White-light index regarding different ratios of the dimensions in the first embodiment.

| No. | Ratio of the dimension of the red (R) lighting unit | Ratio of the dimension of the green (G) lighting unit | Ratio of the dimension of the blue (B) lighting unit | White-light index |
|---|---|---|---|---|
| 1 | 1 | 6 | 10 | 90 |
| 2 | 1 | 7.5 | 11 | 92 |

TABLE 1-continued

White-light index regarding different ratios
of the dimensions in the first embodiment.

| No. | Ratio of the dimension of the red (R) lighting unit | Ratio of the dimension of the green (G) lighting unit | Ratio of the dimension of the blue (B) lighting unit | White-light index |
|---|---|---|---|---|
| 3 | 1 | 8 | 12 | 95 |
| 4 | 1 | 8.5 | 12.5 | 93 |
| 5 | 1 | 8.75 | 13 | 89 |
| 6 | 1 | 9 | 14 | 88 |

Figure 3:
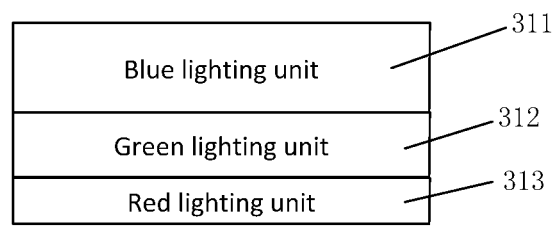
FIG. 3 is a schematic view of the quantum-dot-lighting layer of the quantum dot lighting device in accordance with a second embodiment.

Also referring to FIG. 3, FIG. 3 is a schematic view of the quantum-dot-lighting layer of the quantum dot lighting device in accordance with a second embodiment.

Preferably, the red lighting unit 313, the green lighting unit 312, and the blue lighting unit 311 are stacked together in turn. Preferably, the ratio of the volume of the blue lighting unit 311, the green lighting unit 312, and the red lighting unit 313 are configured to be (10~14):(6~9):1.

The blue lighting unit 311, the green lighting unit 312, and the red lighting unit 313 are arranged along a direction from top to down. The blue lighting unit 311 is arranged at the top. As the quantum dot lighting device is configured to emit from the top. The light beams are emitted upward from the blue lighting unit 311, and the possibility of the emitted light beams have been absorbed by the green lighting unit 312 and the red lighting unit 313 is reduced. Thus, the number of the blue quantum dots needed is reduced.

In an example, the ratio of the dimensions of the blue lighting unit 311, the green lighting unit 312, and the red lighting unit 313 are configured to be (10~14):(6~9):1. Also referring to Table 2, preferably, the ratio of the dimensions of the blue lighting unit 311, the green lighting unit 312, and the red lighting unit 313 are configured to be 10.4:7.2:1. In this scenario, the white-light index is the best.

TABLE 2

White-light index regarding different ratios
of the dimensions in the second embodiment.

| No. | Ratio of the dimension of the red (R) lighting unit | Ratio of the dimension of the green (G) lighting unit | Ratio of the dimension of the blue (B) lighting unit | White-light index |
|---|---|---|---|---|
| 1 | 1 | 6 | 10 | 95 |
| 2 | 1 | 7.2 | 10.4 | 97 |
| 3 | 1 | 8 | 11 | 92 |
| 4 | 1 | 8.2 | 11.4 | 90 |
| 5 | 1 | 8.8 | 12 | 87 |
| 6 | 1 | 9 | 14 | 83 |

Figure 4:
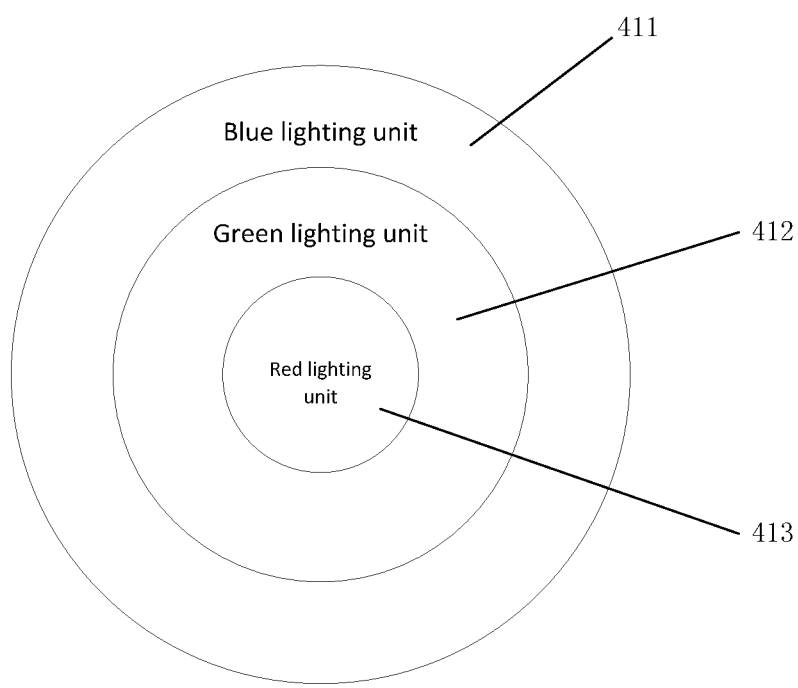
FIG. 4 is a schematic view of the quantum-dot-lighting layer of the quantum dot lighting device in accordance with a third embodiment.

Also referring to FIG. 1, FIG. 4 is a schematic view of the quantum-dot-lighting layer of the quantum dot lighting device in accordance with a third embodiment. In the embodiment, the quantum-dot-lighting layer 41 is circular-shaped. The blue lighting unit 411, the green lighting unit 412, and the red lighting unit 413 are ring-shaped. The red lighting unit 413 is a circle and is arranged at a center of the quantum-dot-lighting layer 41. The green lighting unit 412 is arranged between the red lighting unit 413 and the blue lighting unit 411. Preferably, the quantum-dot-lighting layer 41 is a circle, and the blue lighting unit 411, and the green lighting unit 412 are ring-shaped. Preferably, the red lighting unit 413 is a circle, and the blue lighting unit 411, the green lighting unit 412, and the red lighting unit 413 are arranged along radius toward the center of the quantum-dot-lighting layer 41. The ratio of the radius of the blue lighting unit 411, the green lighting unit 412, and the red lighting unit 413 are configured to be (10~14):(6~9):1.

The blue lighting unit 411, the green lighting unit 412, and the red lighting unit 413 are arranged in a circular way. The blue lighting unit 411, the green lighting unit 412, and the red lighting unit 413 are arranged along a direction from the exterior toward the interior of the circle. The light beams are emitted from the blue lighting unit 411 toward a rim of the blue lighting unit 411, and the possibility of the emitted light beams have been absorbed by the green lighting unit 412 and the red lighting unit 413 is reduced. Thus, the number of the blue quantum dots needed is reduced.

In the embodiment, the ratio of the dimensions of the blue lighting unit 411, the green lighting unit 412, and the red lighting unit 413 are configured to be (10~14):(6~9):1. Also referring to Table 3, preferably, the ratios of the radius of the blue lighting unit 411, the green lighting unit 412, and the red lighting unit 413 are configured to be 13:7:1. In this scenario, the white-light index is the best, wherein the above-mentioned radius relates to the outer diameter of the blue lighting unit 411 and the green lighting unit 412.

In other embodiments, the ratios of the difference respectively between the outer diameter and the internal diameter of the blue lighting unit 411, the green lighting unit 412, and the red lighting unit 413 are configured to be (10~14):(6~9):1. In another example, the ratios of the dimension of the blue lighting unit 411, the green lighting unit 412, and the red lighting unit 413 are configured to be (10~14):(6~9):1.

TABLE 3

White-light index regarding different ratios
of the dimensions in the third embodiment.

| No. | Ratio of the radius of the red (R) lighting unit | Ratio of the radius of the green (G) lighting unit | Ratio of the radius of the blue (B) lighting unit | White-light index |
|---|---|---|---|---|
| 1 | 1 | 6 | 10 | 90 |
| 2 | 1 | 7.5 | 11 | 94 |
| 3 | 1 | 7 | 13 | 96 |
| 4 | 1 | 8 | 13.2 | 91 |
| 5 | 1 | 8.5 | 13.8 | 92 |
| 6 | 1 | 9 | 14 | 89 |

In view of the above, the number of the blue quantum dots is larger than the number of the green quantum dots, and the number of the green quantum dots is larger than the number of the red quantum dots. With such configuration, the blue light beams are prevented from being absorbed by the red and green lighting unit. At the same time, the green light beams are prevented from being absorbed by the red lighting unit. Thus, the blue lighting unit, the red lighting unit, and the green lighting unit may emit soft white light beams, i.e., the white light beams having better index. In this way, the material of quantum dots may be reduced, and the purity of the white light beams is enhanced. It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. A quantum dot lighting device, comprising:
a quantum-dot-lighting layer and two main structural layers being arranged at two sides of the quantum-dot-lighting layer along a vertical direction;

the quantum-dot-lighting layer comprising a red lighting unit, a green lighting unit, and a blue lighting unit, the red lighting unit comprising red quantum dots, the green lighting unit comprising green quantum dots, and the blue lighting unit comprising blue quantum dots, a number of the blue quantum dots is larger than the number of the green quantum dots, and the number of the green quantum dots is larger than the number of the red quantum dots; and wherein the main structural layer comprising a substrate, an anode, a cavity injection layer, a cavity transportation layer, an electron transportation layer, an electron injection layer, and a cathode, and the anode, the cavity injection layer, the cavity transportation layer, the electron transportation layer, the electron injection layer, and the cathode being stacked on the substrate in turn; and the main structural layer further comprising a cavity blocking layer and an electron blocking layer, the cavity blocking layer being arranged between the electron transportation layer and the quantum-dot-lighting layer, the electron blocking layer being arranged between the cavity transportation layer and the quantum-dot-lighting layer, reflective rates of the quantum-dot-lighting layer, the cavity blocking layer, the electron transportation layer, the electron injection layer, the cathode being configured to be increased gradually in sequence, and the reflective rates of the quantum-dot-lighting layer, the electron blocking layer, the cavity transportation layer, the cavity injection layer, and the anode being configured to be increased gradually in sequence.

2. The quantum dot lighting device as claimed in claim 1, wherein the quantum-dot-lighting layer is rectangular-shaped, and the blue lighting unit is arranged between the red lighting unit and the green lighting unit.

3. The quantum dot lighting device as claimed in claim 2, wherein the red lighting unit, the blue lighting unit, and the green lighting unit are arranged along a diagonal line of the rectangular quantum-dot-lighting layer.

4. The quantum dot lighting device as claimed in claim 3, wherein ratios of the dimensions of the blue lighting unit, the green lighting unit, and the red lighting unit are configured to be (10~14):(6~9):1.

5. The quantum dot lighting device as claimed in claim 1, wherein the red lighting unit, the green lighting unit, and the blue lighting unit are stacked together in turn.

6. The quantum dot lighting device as claimed in claim 5, wherein ratios of the volume of the blue lighting unit, the green lighting unit, and the red lighting unit are configured to be (10~14):(6~9):1.

7. The quantum dot lighting device as claimed in claim 1, wherein the quantum-dot-lighting layer is circular-shaped, the blue lighting unit, the green lighting unit, and the red lighting unit are ring-shaped, the red lighting unit is a circle and is arranged at a center of the quantum-dot-lighting layer, and the green lighting unit is arranged between the red lighting unit and the blue lighting unit.

8. The quantum dot lighting device as claimed in claim 7, wherein ratios of the radius of the blue lighting unit, the green lighting unit, and the red lighting unit are configured to be (10~14):(6~9):1.

* * * * *